(12) United States Patent
Hilgers et al.

(10) Patent No.: US 11,189,779 B2
(45) Date of Patent: Nov. 30, 2021

(54) ELECTROACTIVE POLYMER ACTATOR

(71) Applicant: KONINKLIJKE PHILIPS N.V., Eindhoven (NL)

(72) Inventors: Achim Hilgers, Alsdorf (DE); Mark Thomas Johnson, Arendonk (BE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 512 days.

(21) Appl. No.: 16/304,817

(22) PCT Filed: Jun. 7, 2017

(86) PCT No.: PCT/EP2017/063883
§ 371 (c)(1),
(2) Date: Nov. 27, 2018

(87) PCT Pub. No.: WO2017/211914
PCT Pub. Date: Dec. 14, 2017

(65) Prior Publication Data
US 2020/0328341 A1 Oct. 15, 2020

(30) Foreign Application Priority Data
Jun. 7, 2016 (EP) .................................... 16173226

(51) Int. Cl.
*H01L 41/193* (2006.01)
*H01L 41/09* (2006.01)
(52) U.S. Cl.
CPC ............ *H01L 41/193* (2013.01); *H01L 41/09* (2013.01)
(58) Field of Classification Search
CPC ............................. H01L 41/193; H01L 41/09

USPC ........................................................ 310/800
See application file for complete search history.

(56) References Cited

U.S. PATENT DOCUMENTS

| | | |
|---|---|---|
| 2002/0130673 A1 | 9/2002 | Pelrine |
| 2010/0039001 A1 | 2/2010 | Kudoh |
| 2011/0108952 A1 | 5/2011 | Chen |
| 2013/0134832 A1 | 5/2013 | Shen et al. |
| 2014/0085065 A1 | 3/2014 | Biggs et al. |

(Continued)

FOREIGN PATENT DOCUMENTS

| | | |
|---|---|---|
| JP | 2010161894 A | 7/2010 |
| JP | 2014-154742 A | 8/2014 |
| RU | 2568944 C2 | 11/2015 |

(Continued)

OTHER PUBLICATIONS

Carpi, F., & et.al. (2011). Dielectric Elastomers as Electromechanical Transducers: Fundamentals, Materials, Devices, Models and Applications of an Emerging Electroactive Polymer Technology. Oxford: Elsevier Section 6.2.

(Continued)

*Primary Examiner* — Derek J Rosenau
(74) *Attorney, Agent, or Firm* — Schott, P.C.

(57) ABSTRACT

The invention provides an electroactive polymer actuator comprising a capacitance compensation means adapted to at least partially offset any changes in the capacitance across the member induced by its deformation. In this way, the electronic control of the device is rendered much simpler, since a varying capacitance across the actuator member does not have to be accounted for when driving the actuator to perform a particular deformation.

20 Claims, 5 Drawing Sheets

(56) References Cited

U.S. PATENT DOCUMENTS

2014/0300247 A1* 10/2014 Takamatsu ........... C07D 233/00
310/300
2015/0202656 A1* 7/2015 Takahashi ............ H04R 19/005
310/300

FOREIGN PATENT DOCUMENTS

WO  2005081676 A2  9/2005
WO  2012032443 A1  3/2012

OTHER PUBLICATIONS

Raju, G. G. (2003). Dielectrics in Electric Fields. New York: CRC Press.p. 89.
Shakun, A. (2014). Soft Elastomeric Material with Improved Dielectric Permittivity. Thesis, 20, section. 2.3.
Somiya, S. (2013). Handbook of Advanced Ceramics: Materials, Applications, Processing, and Properties. In Nonlinear Dielectricity of MLCCs (p. 415). Waltham: Academic Press.

* cited by examiner

ELECTROACTIVE POLYMER ACTATOR

CROSS-REFERENCE TO PRIOR APPLICATIONS

This application is the U.S. National Phase application under 35 U.S.C. § 371 of International Application No. PCT/EP2017/063883, filed on Jun. 7, 2017, which claims the benefit of EP Patent Application No. EP 16173226.8, filed on Jun. 7, 2016. These applications are hereby incorporated by reference herein.

FIELD OF THE INVENTION

This invention relates to electroactive polymer actuators.

BACKGROUND OF THE INVENTION

Electroactive polymers (EAPs) are an emerging class of materials within the field of electrically responsive materials. EAPs can work as sensors or actuators and can easily be manufactured into various shapes allowing easy integration into a large variety of systems.

Materials have been developed with characteristics such as actuation stress and strain which have improved significantly over the last ten years. Technology risks have been reduced to acceptable levels for product development so that EAPs are commercially and technically becoming of increasing interest. Advantages of EAPs include low power, small form factor, flexibility, noiseless operation, accuracy, the possibility of high resolution, fast response times, and cyclic actuation.

The improved performance and particular advantages of EAP material give rise to applicability to new applications.

An EAP device can be used in any application in which a small amount of movement of a component or feature is desired, based on electric actuation. Similarly, the technology can be used for sensing small movements. This invention relates in particular to actuators.

The use of EAPs enables functions which were not possible before, or offers a big advantage over common actuator solutions, due to the combination of a relatively large deformation and force in a small volume or thin form factor, compared to common actuators. EAPs also give noiseless operation, accurate electronic control, fast response, and a large range of possible actuation frequencies, such as 0-1 MHz, most typically below 20 kHz.

Devices using electroactive polymers can be subdivided into field-driven and ionic-driven materials.

Examples of field-driven EAPs include Piezoelectric polymers, Electrostrictive polymers (such as PVDF based relaxor polymers) and Dielectric Elastomers. Other examples include Electrostrictive Graft polymers, Electrostrictive paper, Electrets, Electroviscoelastic Elastomers and Liquid Crystal Elastomers.

Examples of ionic-driven EAPs are conjugated/conducting polymers, Ionic Polymer Metal Composites (IPMC) and carbon nanotubes (CNTs). Other examples include ionic polymer gels.

Field-driven EAPs are actuated by an electric field through direct electromechanical coupling. They usually require high fields (volts per meter) but low currents. Polymer layers are usually thin to keep the driving voltage as low as possible. Ionic EAPs are activated by an electrically induced transport of ions and/or solvent. They usually require low voltages but high currents. They require a liquid/gel electrolyte medium (although some material systems can also operate using solid electrolytes).

Both classes of EAP have multiple family members, each having their own advantages and disadvantages.

A first notable subclass of field driven EAPs are Piezoelectric and Electrostrictive polymers. While the electromechanical performance of traditional piezoelectric polymers is limited, a breakthrough in improving this performance has led to PVDF relaxor polymers, which show spontaneous electric polarization (field driven alignment). These materials can be pre-strained for improved performance in the strained direction (pre-strain leads to better molecular alignment). Normally, metal electrodes are used since strains usually are in the moderate regime (1-5%). Other types of electrodes (such as conducting polymers, carbon black based oils, gels or elastomers, etc.) can also be used. The electrodes can be continuous, or segmented.

Another subclass of interest of field driven EAPs is that of Dielectric Elastomers. A thin film of this material may be sandwiched between compliant electrodes, forming a parallel plate capacitor. In the case of dielectric elastomers, the Maxwell stress induced by the applied electric field results in a stress on the film, causing it to contract in thickness and expand in area. Strain performance is typically enlarged by pre-straining the elastomer (requiring a frame to hold the pre-strain). Strains can be considerable (10-300%). This also constrains the type of electrodes that can be used: for low and moderate strains, metal electrodes and conducting polymer electrodes can be considered, for the high-strain regime, carbon black based oils, gels or elastomers are typically used. The electrodes can be continuous, or segmented.

A first notable subclass of ionic EAPs is Ionic Polymer Metal Composites (IPMCs). IPMCs consist of a solvent swollen ion-exchange polymer membrane laminated between two thin metal or carbon based electrodes and requires the use of an electrolyte. Typical electrode materials are Pt, Gd, CNTs, CPs, Pd. Typical electrolytes are Li+ and Na+ water-based solutions. When a field is applied, cations typically travel to the cathode side together with water. This leads to reorganization of hydrophilic clusters and to polymer expansion. Strain in the cathode area leads to stress in rest of the polymer matrix resulting in bending towards the anode. Reversing the applied voltage inverts bending. Well known polymer membranes are Nafion® and Flemion®.

Another notable subclass of Ionic polymers is conjugated/conducting polymers. A conjugated polymer actuator typically consists of an electrolyte sandwiched by two layers of the conjugated polymer. The electrolyte is used to change oxidation state. When a potential is applied to the polymer through the electrolyte, electrons are added to or removed from the polymer, driving oxidation and reduction. Reduction results in contraction, oxidation in expansion.

In some cases, thin film electrodes are added when the polymer itself lacks sufficient conductivity (dimension-wise). The electrolyte can be a liquid, a gel or a solid material (i.e. complex of high molecular weight polymers and metal salts). Most common conjugated polymers are polypyrolle (PPy), Polyaniline (PANi) and polythiophene (PTh).

An actuator may also be formed of carbon nanotubes (CNTs), suspended in an electrolyte. The electrolyte forms a double layer with the nanotubes, allowing injection of charges. This double-layer charge injection is considered as the primary mechanism in CNT actuators. The CNT acts as an electrode capacitor with charge injected into the CNT, which is then balanced by an electrical double-layer formed by movement of electrolytes to the CNT surface. Changing the charge on the carbon atoms results in changes of C—C bond length. As a result, expansion and contraction of single CNT can be observed.

FIGS. 1 and 2 show two possible operating modes for an EAP device.

The device comprises an electroactive polymer layer 14 sandwiched between electrodes 10, 12 on opposite sides of the electroactive polymer layer 14.

FIG. 1 shows a device which is not clamped. A voltage is used to cause the electroactive polymer layer to expand in all directions as shown.

FIG. 2 shows a device which is designed so that the expansion arises only in one direction. The device is supported by a carrier layer 16. A voltage is used to cause the electroactive polymer layer to curve or bow.

Together, the electrodes, electroactive polymer layer, and carrier may be considered to constitute the overall electroactive polymer structure.

The nature of this movement for example arises from the interaction between the active layer which expands when actuated, and the passive carrier layer. To obtain the asymmetric curving around an axis as shown, molecular orientation (film stretching) may for example be applied, forcing the movement in one direction.

The expansion in one direction may result from the asymmetry in the EAP polymer, or it may result from asymmetry in the properties of the carrier layer, or a combination of both.

The change of form induced by electrical stimulation of EAPs hence has many useful applications. However, the stimulation of the material is also accompanied by a change in the complex impedance exhibited by the actuator device. More particularly, the reactance $iX_C$ changes its value due substantially to the induced reduction in the EAP (layer) thickness.

The greatest impact on the EAP reactance is the input capacitance. Modeling the EAP actuator as a (multilayer) plate capacitor, the capacitance may be approximated as follows:

$$C = n \cdot \frac{\epsilon_0 \cdot \epsilon_r \cdot a \cdot b}{d} \quad (1)$$

where C is the input capacitance, n the number of internal active EAP layers, $\epsilon_0$ the permittivity of a vacuum, $\epsilon_r$ the relative permittivity of the EAP material, a and b the length and width of the EAP layer (so that a*b=surface area of layer), and d the EAP layer thickness. For layers which are not rectangular, a.b may be replaced by an equivalent appropriate expression representing surface area of the EAP layer.

When an EAP layer is electrically stimulated, the thickness d is reduced. The lateral dimensions a and b are also at the same time expanding (i.e., more generally, the surface area is expanding). As a consequence, capacitance increases. FIG. 3 illustrates the relationship between capacitance (y-axis) and applied DC-voltage (x-axis) for an exemplary EAP layer. As shown by the depicted graph, across the range of driving voltages from 0V to 250V, a total increase in input capacitance of approximately 78% is observed.

SUMMARY OF THE INVENTION

It has been observed by the inventors of the present invention that the above-described variation in the capacitance of the EAP layer as a function of applied voltage adds significant complication to the electronic operation of an actuator device, since the changing capacitance must be compensated in the applied electric signals, requiring more complex driving electronics. This may necessitate either adjusting the voltage or current supplied to the EAP layer in real time as the deformation occurs, or, in the case that the device is charged only once (using a 'sample and hold' driving scheme), it may necessitate accounting in advance for the resultant change in capacitance and applying an initial charging voltage accordingly. In either case, accounting for this additional dependency requires supplementary driving electronics which add to the cost, complexity and bulk of an EAP actuator device.

Compounding this complication is a further characteristic behaviour of electrically stimulated EAP layers, wherein the EAP material exhibits a delay or lag in reaching its final deflection position. This is illustrated in FIG. 4, which shows the relationship between EAP layer deflection (y-axis) and time (x-axis) for an exemplary EAP material stimulated at two different example voltages: 120V (24) and 200V (26). The deflection is shown in units of μm and time in seconds.

It can be observed from the graph that even after a period of 40 seconds, the EAP layer has not yet reached its final deflection for either the 120V stimulation or the 200V stimulation. In addition, the extent of the delay becomes greater for higher driving voltages.

At least a part of the exhibited delay is attributable simply to the intrinsic physical relaxation processes of the polymer, which are by nature very slow. However, the delay is exacerbated by the capacitance-deformation relation described above. As the EAP layer slowly approaches its final deflection position, so the capacitance across the layer continues to increase accordingly. This in turn requires an on-going charging of the electroactive polymer material or dielectric, which itself then leads to a further deflection of the EAP (since the electric field across the EAP layer is increased in strength).

A further disadvantage of this behaviour is the necessary electrical driving of the non-constant capacitive load. Due to the changing capacitance, it is necessary not only that the EAP actuator is charged upon initial activation, but that a further current is supplied continuously in order to augment the charge as the device's input capacity increases. This requires more complex driving electronics.

This is of particular importance if the EAP actuator is being addressed in accordance with a 'sample and hold' driving scheme, of a type used for example in matrix addressing of an EAP array. In such a scheme, the EAP is only briefly connected to a voltage source (the voltage is "sampled") and then is isolated for the majority of the driving time. The EAP in this case is simply "holding" a fixed amount of charge. In this case, any changes of capacitance during driving will result in an 'incorrect' (or unintended) final voltage applying across the device, and hence the wrong final deformation (since the voltage will change as the capacitance changes for a fixed charge).

In view of the aforementioned disadvantages, the inventors have identified a need for an EAP actuator device capable of providing electrically stimulated actuation wherein the accompanying complications associated with deformation dependent capacitance are ameliorated or avoided.

The invention as defined by the independent claims aims to fulfil the aforementioned need. The dependent claims define advantageous embodiments.

Accordingly, in accordance with an aspect of the invention, there is provided an actuator member, exhibiting a capacitance across it, and comprising:

an electroactive polymer material which is adapted to deform in dependence upon the magnitude of an applied electric field; and a capacitance compensation means adapted to at least partially offset changes in said capacitance caused by deformation of the actuator member.

The invention is based on the principle of compensating for the known variation of capacitance with actuation state 'in advance', by means of adapting the intrinsic electrical properties of the actuator member itself. The actuator member is provided having a capacitance compensation means engineered to manipulate or alter the exhibited capacitance across the actuator member so as to partially or fully correct or offset any variation induced as the actuator is stimulated to deform. The capacitance compensation means is adapted to effect an adjustment in the capacitance of the actuator member to at least partially offset changes in said capacitance caused by deformation of the actuator member. The result is an actuator member adapted to exhibit a substantially uniform or constant capacitance regardless of its degree of deformation. This also means that the delay or lag in the actuator reaching its final deflection position (illustrated in FIG. 4) may be significantly reduced.

The capacitance compensation means may take wide variety of different forms. In general however, it comprises the use of one or more materials having electrical properties which, when incorporated into the structure of the actuator member, have the effect of changing the observable trend or relation between the exhibited capacitance across the actuator member and one or more of: the degree of deformation of the actuator, the magnitude of an applied electric field across the actuator and the impressed electric charge on active outer surfaces of the actuator member. In particular, embodiments of the invention may comprise capacitance compensation means adapted to realise a capacitance which exhibits no observable change with deformation, electric field and/or impressed electric charge.

The term 'offset' is used in the sense for example of 'counteract', 'compensate' or 'counter-pose', and is intended simply to imply that the capacitance compensation means partially or fully returns the capacitance to the level that it would have been at in the absence of any electrically-induced deformation or applied electrical field. The capacitance compensation means may have the effect of fully or substantially maintaining or holding the capacitance at a set, constant value.

According to at least one set of embodiments, the capacitance compensation means is adapted to offset said changes in capacitance by reducing the relative permittivity of at least a portion of the actuator member.

Since the capacitance is directly proportional to relative permittivity $\varepsilon_r$ (see equation 1 above), by reducing the relative permittivity of at least a portion of the actuator, the capacitance exhibited across at least that portion is reduced. The capacitance compensation means may be adapted for example to effect a decrease in the exhibited relative permittivity of a magnitude which varies in congruence with the variation of capacitance induced by the deformation of the actuator.

The capacitance compensation means may be adapted for example to induce a decrease in the relative permittivity of the actuator member in dependence upon one or more of the following: increasing magnitude of an applied electric field, increases in the impressed electric charge, mechanical deformation of the actuator member. This exhibited dependency may fully or partially match the relationship between the capacitance of the actuator member (in the absence of the compensating means) and one or more of: increasing magnitude of an applied electric field, increases in the impressed electric charge, and mechanical deformation of the actuator member.

According to at least one set of examples, the capacitance compensation means may comprise a compensating material which independently exhibits a decrease in capacitance across it in response to one or more of the following: increasing magnitude of an applied electric field, increase in the impressed electric charge, mechanical deformation of the actuator member.

This dependency may fully, substantially or partially match the relationship exhibited between the capacitance of the actuator member (in the absence of the compensating means) and the same of those three properties.

More particularly, the capacitance compensation means may comprise a compensating material which independently exhibits a decrease in effective relative permittivity.

The compensating material on its own exhibits in this case an effective relative permittivity which varies in dependence upon one or more of said variables. When this material is incorporated into the body of the actuator member, this dependency may be such as to effect a corresponding alteration of the capacitance so as to fully or partially offset the capacitance change induced by deformation of the actuator member.

In accordance with this set of examples, the capacitance compensation means may comprise a plurality of particles formed of said compensating material, said particles being embedded within the electroactive polymer material. The embedded particles may have the effect of altering or biasing the overall exhibited capacitance and/or relative permittivity across the actuator member.

The capacitance compensation means may comprise a coating formed of said compensating material, covering at least a portion of the electroactive polymer material. This may be provided either on its own or in combination with the embedded particles described above. The coating may have a similar effect of influencing, biasing or changing the exhibited behaviour of the capacitance (or relative permittivity) so that the overall exhibited capacitance across the device is substantially constant regardless of the deformation of the actuator member.

The actuator member may comprise at least a first layer of electroactive polymer material, and at least a second layer comprising the compensating material. The at least second layer of compensating material may be directly coupled to, or arranged at least adjacent to the EAP material layer. It may have the effect of biasing or altering the overall exhibited capacitance or relative permittivity of the actuator member.

According to at least a further set of examples, the capacitance compensation means may comprise a material which forms a mixture or composite with the electroactive polymer material, the mixture or composite exhibiting a decrease in a capacitance across it or a decrease in effective relative permittivity in response to one or more of: increasing magnitude of an applied electric field, increase in the impressed electric charge, and mechanical deformation of the actuator member.

The compensation means according to this set of examples may or may not on its own exhibit compensatory electrical properties, for instance a capacitance or effective relative permittivity which vary in dependence upon deformation of the actuator. However, when combined with the EAP material to form a composite or mixture, the resultant composite or mixture does exhibit the desirable electrical properties.

The mixture or composite may exhibit a relative permittivity which decreases in dependence upon deformation, impressed charge, or applied electric field. This may then offset the capacitance variation caused by deformation in the absence of the compensation means. The mixture or composite may intrinsically exhibit a capacitance which would tend to vary with applied electric field or impressed charge for instance, such that this capacitance variation may combine with the variation induced by deformation to substantially nullify or cancel it out.

In all cases, according to this set of examples, the actuator member may comprise or consist of one or more layers of said mixture or composite.

The actuator member may alternatively or additionally comprise at least a first layer of electroactive polymer material and at least a second layer formed of said mixture or composite.

According to any of the above-described examples and embodiments, there may further be included in the actuator member a permittivity biasing material adapted to permanently alter the relative permittivity of at least a portion of the actuator member. By 'permanently alter' is meant induce or effect a permanent (static) offset or bias to the relative permittivity exhibited by one or more portions of the actuator member.

The permittivity biasing material may in examples be combined with one or more of the electroactive polymer material and the capacitance compensation material (or capacitance compensating mixture or composite). This may be achieved by mixing the materials, or by providing a layer of biasing material within a multi-layer actuator member. The biasing material in these cases does not impede any field/charge/deformation dependency of the relative permittivity, but simply imposes a fixed bias or offset, such that the relative permittivity begins at a higher or lower level and ends at a higher or lower level.

In particular examples, the biasing material may be mixed or combined at least with the electroactive polymer material in order to directly alter the base-line, or static, relative permittivity of the electroactive polymer.

The effect of imposing a fixed permittivity bias or offset may be to change the range of field strengths across which the actuator member is mechanically responsive. By statically increasing the base-line relative permittivity, the electroactive polymer material may become responsive at a lower range of electric field strengths (i.e. may deform in response to lower-voltage electrical stimuli). This may be of advantage in cases where the provision or application of otherwise high voltages is impractical or undesirable. For example, such an adaptation may increase the range of possible applications or implementations of the self-compensating EAP actuator, by enabling it to be incorporated within lower-voltage circuits.

Additionally, certain potential compensating materials may exhibit the desired field-dependent permittivity only at or across a particular range of applied electric field strengths. By introducing a suitable permittivity biasing material to the actuator member, the range of field strengths over which the actuator is responsive may be changed (as discussed in the preceding paragraph) so as to exactly match the range of field strengths over which the compensating material exhibits the required field-dependent (relative) permittivity.

The actuator member may comprise at least a first layer and second layer, each of the first and second layer being adapted to exhibit a capacitance or an effective relative permittivity which decreases in response to one or more of: an increasing magnitude of an applied electric field, increase in the impressed electric charge, and mechanical deformation of the actuator member, and wherein each layer is adapted to exhibit said decreasing capacitance or effective relative permittivity only across a different particular range of applied electric field strengths, impressed electric charge values, or mechanical deformations.

In more particular examples, this effect may be achieved by incorporation into one or more of the at least first and second layers a permittivity biasing material adapted to permanently alter the relative permittivity of at least a portion of the actuator member.

By using more than one layer, capacitance compensation may be achieved across a broad range of different actuation states and electrical stimulation strengths, even where the particular material or composite used to provide compensation in each layer has only a limited range of applicability. Moreover, a multiple-layer structure such as this allows the logarithmic-like relation between capacitance and applied voltage (shown in FIG. 3) to be more easily, cheaply and simply compensated. Different materials or compensation means for example may be used in each layer, each providing a particular level or magnitude of capacitance biasing or offset. By constructing the actuator structure having multiple layers of different biasing magnitudes which become successively activated as the actuator is deformed to a greater and greater extent, the specific pattern of required capacitance compensation may be readily achieved.

According to one or more sets of examples, the actuator member may comprise at least a first layer and a second layer, each of the first and the second layer being adapted to exhibit a capacitance or an effective relative permittivity which decreases in response to a different one of the following: increasing magnitude of an applied electric field, increase in the impressed electric charge, and mechanical deformation of the actuator member.

Each layer may be adapted to exhibit said decreasing capacitance or effective relative permittivity only across a different particular range of frequencies of applied electric field.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides an electroactive polymer actuator comprising a capacitance compensation means adapted to at least partially offset any changes in the capacitance across the member induced by its deformation. In this way, the electronic control of the device is rendered much simpler, since a varying capacitance across the actuator member does not have to be accounted for when driving the actuator to perform a particular deformation.

According to at least one envisaged set of embodiments, the capacitance compensation is achieved by means of manipulation or alteration of effective (or average) relative permittivity constant (or dielectric constant) $\varepsilon_r$ of the actuator member. In particular, according to one set of embodiments, there is provided a self-compensating EAP actuator which is distinguished from the state of the art EAP actuators in being adapted to reduce or eliminate variation of the overall effective relative permittivity $\varepsilon_r$ of the actuator structure as a function of one or more of the following: a) The applied electrical voltage, b) the impressed electric charge on charged plates or surfaces of the member, and c) the mechanical deformation of the actuator member.

Reducing the variation in overall or average $\varepsilon_r$ of the actuator member is achieved in at least one set of examples through incorporation of materials independently exhibiting an intrinsic permittivity value $\varepsilon_r$ which decreases as a function of one or more of a), b) and c) above. These materials naturally exhibit a capacitance which decreases as a function of these variables, and hence can be used to compensate for, and at least partially offset, the increase in capacitance otherwise exhibited by the deforming electroactive polymer.

Materials which exhibit a decrease in capacitance with increasing applied voltage or magnitude of applied electric field, at the typical frequency range at which an EAP polymer is operated (in the kHz), are however unusual. In a static case, all materials tend to increase their capacitance as voltage (or charge state) increases (due to the second law of thermodynamics).

However, there do exist certain classes of materials which, due to dynamic factors such as delays in re-ordering of molecular dipoles or slow rotation of liquid crystals, can exhibit a decrease of dynamic capacitance at certain frequency ranges.

In the field in particular of (multilayer) ceramic capacitors, the effect of non-linear dielectricity has been explored (see for example: Somiya, S. (2013). Handbook of Advanced Ceramics: Materials, Applications, Processing, and Properties. In *Nonlinear Dielectricity of MLCCs* (p. 415). Waltham: Academic Press).

Figure 5:
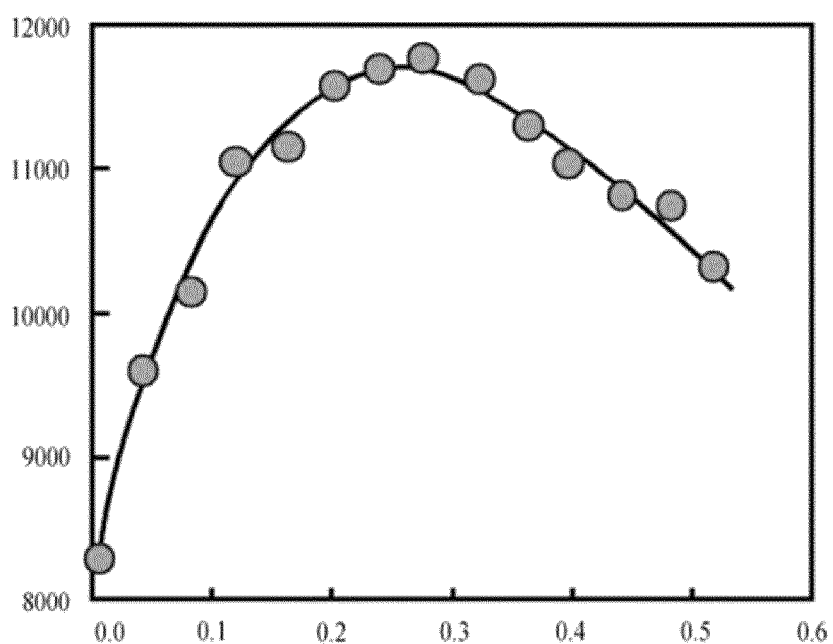
FIG. 5 shows the relationship between relative permittivity and magnitude of applied electric field for an example capacitance compensating material.

One example of a material which is known to exhibit strong dielectric non-linearity is Barium-Zirconium-Titanium (BZT). The relationship between the relative permittivity of BZT and amplitude of an applied AC electric field is shown in FIG. 5, where (dimensionless) relative permittivity is represented on the y-axis and the amplitude of applied AC field (in kV/mm) is represented on the x-axis. The AC field was applied having a frequency of 10 kHz.

It can be seen from the graph that the relative permittivity $\varepsilon_r$ of BZT initially increases at lower field strengths, reaching a peak of approximately 11750 at a field strength of approximately 0.28 kV/mm. Beyond approximately 0.3 kV/mm, the relative permittivity exhibits a clear decline in value as a function of increasing electric field strength.

Incorporating this material (or a similarly behaving material, as known in the field of ceramics for instance) into the structure or active layers of an EAP actuator member would have an impact on the effective (average) relative permittivity constant of the actuator member as a whole (at least for higher field strengths, and higher AC frequencies).

In addition to this, further examples of suitable materials for altering the effective (average) relative permittivity may be revealed by consideration of higher order terms in the Langevin function for orientational polarisation of dielectric materials (discussed in Raju, G. G. (2003). Dielectrics in Electric Fields. New York: CRC Press). The function describes the following relationship between average dipole moment in the direction of an applied electric field, $\mu_0$, and the permanent moment of a single dipole $\mu$:

$$\frac{\mu_0}{\mu} = \coth x - \frac{1}{x} \quad (2)$$

where x=μE/kT (E=electric field strength, k=Boltzmann constant, and T=temperature). The expression on the right hand is recognisable as the well-known Langevin function.

The higher order terms of this formula become relevant only at high electric field strengths (in the order of MV/m or greater), and hence are especially relevant in the case of dielectric EAPs which are typically stimulated at field strengths >10 W/μm. However, they also have potential applicability for other varieties of EAP: the behaviour holds for any suitable material stimulated at sufficiently high electric field strengths.

Consideration of these higher order terms of the Langevin formula shows that the relative permittivity decreases at high field strengths. The change in relative permittivity $\Delta\varepsilon_r$ may be expressed as:

$$\Delta\varepsilon_r = -\frac{E^2 N_A \mu^4 C}{45 V \varepsilon_0 (kT)^3} \quad (3)$$

where E is electric field strength, $N_A$ is the Avogadro constant, μ is magnetic permeability, C is a constant, V is the molar volume, Co is the vacuum permittivity, k is the Boltzmann constant, and T is temperature.

Figure 6:
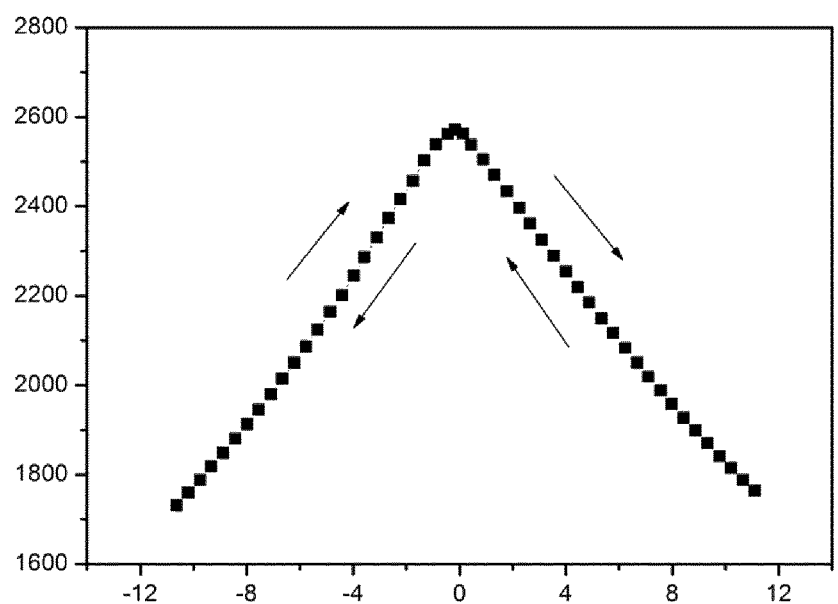
FIG. 6 shows the relationship between relative permittivity and magnitude of applied electric field for a second example capacitance compensating material.

Examples of suitable materials for taking advantage of this effect include Barium Strontium Titanate (BST) materials, which are commonly used for tuneable capacitors. FIG. 6 shows a graph illustrating the (dimensionless) relative permittivity of a sample of BST (y-axis) as a function of applied DC electric field strength (x-axis; units of kV/cm).

It can be seen from the graph that the relative permittivity of BST decreases almost linearly with increasing electric field strength, reducing from a maximum value (for this sample) of approximately 2600 at zero applied field, to a value of around 1750 at an applied field strength of approximately 11 kV/cm. The same relationship is also observed for equivalent electric fields applied in an opposite direction.

The example relative permittivity-decreasing materials discussed above may be incorporated into an actuator structure in a number of ways to achieve the desired effect of providing capacitance compensation as a function of increasing applied electric field strength.

Figure 7:
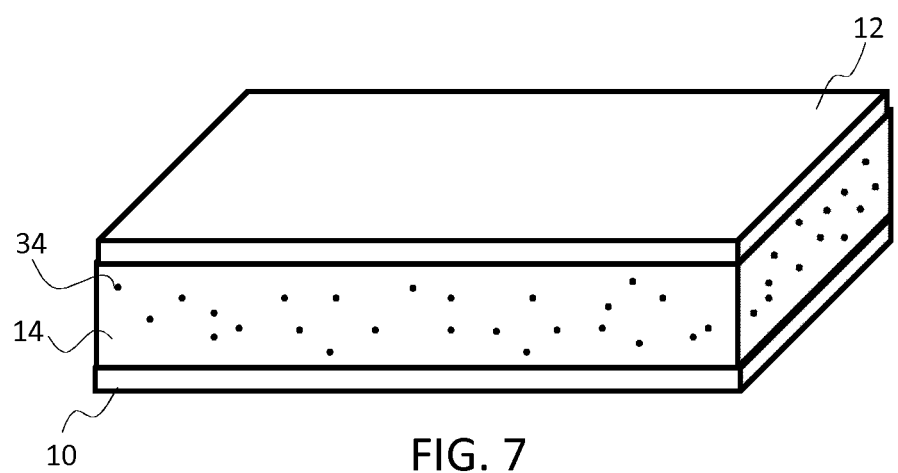
FIG. 7 shows an example actuator member comprising embedded particles of capacitance compensating material.

FIG. 7 shows a first example actuator member in accordance with one or more embodiments of the invention. The structure comprises a layer of electroactive polymer (EAP) material 14 surrounded by a first 10 and second 12 electrode for establishing an electric field across the EAP layer. Embedded within the EAP layer are a plurality of randomly distributed loosely embedded particles 34 of a capacitance compensating material in accordance with one or more of the examples described above, or any other suitable material having the property of exhibiting decreasing relative permittivity with increasing electric field strength (or impressed electric charge, or extent of mechanical deformation).

The particles 34 may be distributed substantially evenly throughout the EAP layer 14. Since the relative permittivity of these particles has the property of decreasing as a function of increasing electric field strength, they have the effect of lowering the overall effective (average) relative permittivity of the entire layer 14. By carefully selecting a suitable material which exhibits a relative permittivity which declines at a rate substantially matching the intrinsic rate of increase in capacitance of the actuator member as a function of applied electric field, it is possible to provide an actuator which exhibits a substantially constant capacitance between the electrodes 10, 12, as a function of electric field strength. This follows from equation (1) which shows that capacitance is linearly dependent upon relative permittivity.

A material may either be selected having the required rate of change of relative permittivity, or a material (generally of the classes discussed above) may be specially fabricated or synthesised to have the required precise rate of change.

Figure 8:
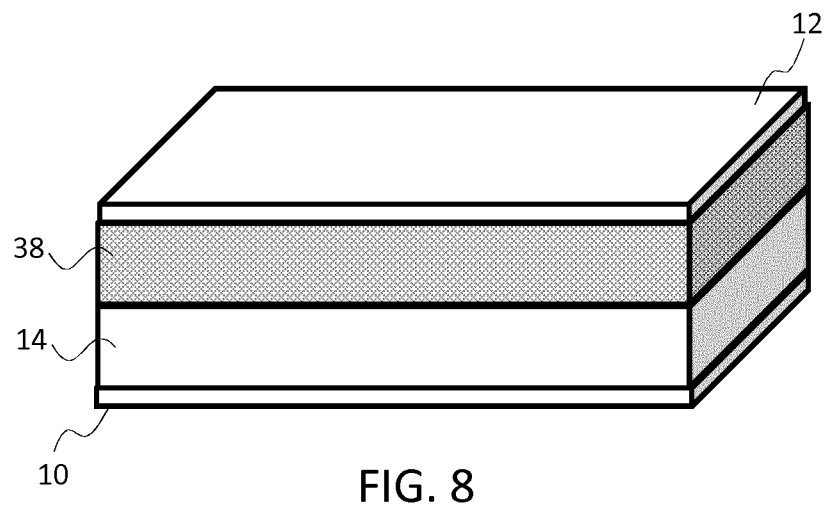
FIG. 8 shows an example actuator member comprising a layer of capacitance compensating material and a layer of electroactive polymer.

FIG. 8 shows a second example actuator member in accordance with one or more embodiments. The structure comprises a first 10 and second 12 electrode, between which are disposed a first layer of electroactive polymer (EAP) material 14 and a second layer 38 of capacitance compensation material in accordance with examples discussed above, or other example materials exhibiting a similar dependency of relative permittivity upon applied electric field (or impressed electric charge, or extent of mechanical deformation).

As in the example of FIG. 7, the compensating material layer has the effect of lowering the overall effective (average) relative permittivity of the actuator member structure as electric field strength increases.

In the example shown, the EAP layer 14 and compensating material layer 38 are directly coupled to one another. However, in alternative examples, these layers may be separated by a suitable interface layer, such as a dielectric layer.

Although only a single EAP layer 14 and a single compensating material layer 38 are provided in the example actuator of FIG. 8, in further examples, a plurality of each type of layer may be provided. These may be alternately arranged for instance, in order to achieve maximal blending of the relative permittivities of the two layer types.

Alternatively or additionally to the above, according to further examples, there may be provided an actuator member comprising at least one EAP layer having a coating formed of a suitable capacitance compensating material. The coating may coat only top and bottom surfaces of the EAP layer, or may coat all external surfaces (including side surfaces) of the layer. The coating layer has a similar effect as the parallel layer 38 in the example of FIG. 8 of changing the relative permittivity of the entire actuator structure as a function of applied electric field strength (or impressed electric charge, or extent of mechanical deformation).

Although in the descriptions and explanations above, materials have been described which exhibit a relative permittivity which varies with applied electric field strength, it is to be understood that these materials may also be understood to vary with other variables. In the case of an EAP actuator, the extent of deformation of the actuator member naturally increases as a function applied electric field strength. Hence the above materials may also be understood to vary as a function of the extent of mechanical deformation of the actuator member. Additionally, since, by Coulomb's law, the electric field strength increases linearly with total quantity of impressed electric charge, then these materials may also be understood to vary with quantity of impressed electric charge on electrodes 10, 12.

Other materials may also be considered having the property of varying in either exhibited capacitance or relative permittivity directly in relation to one or both of the extent of mechanical deformation and impressed electrical charge.

According to a further set of embodiments, there is provided an actuator member being formed of one or more layers of an EAP composite or mixture, the composite or mixture being adapted so as to exhibit a relative permittivity (or capacitance) which decreases as a function of one or more of: applied electric field strength, impressed electric charge on actuator electrodes, and extent of mechanical deformation.

This may, according to examples be achieved by means of mixing an electroactive polymer material with one or more of the capacitance compensating materials discussed above. The resultant mixture may exhibit the electroactive responsive properties of the EAP material while also exhibiting a relative permittivity which decreases as a function of one of: applied electric field strength, impressed electric charge, and extent of mechanical deformation.

The ratio of EAP material to compensating material must be carefully selected so as not to dilute the concentration of electroactive polymer to such an extent that the electroactive properties cease to have effect.

According to further examples, an EAP composite may be provided exhibiting the electroactive properties of an EAP in combination with a field, charge or deformation dependent relative permittivity.

A number of possible configurations exist for an actuator member comprising a capacitance compensating EAP mixture or composite material of the kind described above.

Figure 9:
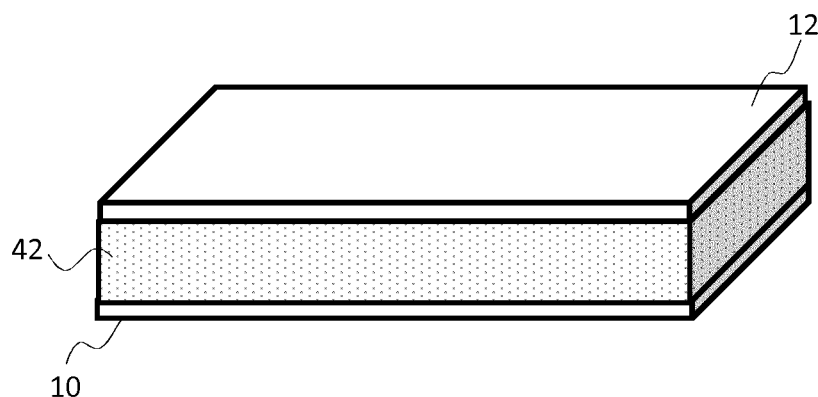
FIG. 9 shows an example actuator member comprising a single layer of an example capacitance compensating composite or mixture.

In FIG. 9 is shown a first example of an actuator member incorporating an example EAP composite, in accordance with the descriptions provided above. The structure comprises a single layer 42 of EAP composite material disposed between a first 10 and second 12 surrounding electrode. The single layer exhibits standard electroactive polymer behaviour, in the sense of deforming in response to an electric field established between first 10 and second 12 electrodes. However, due to the composition of the composite, it is adapted to exhibit an effective relative permittivity (dielectric constant) which decreases as a function of applied electric field at a specially attuned rate.

As an electric field is applied and the actuator begins to deform, so the intrinsic capacitance of the layer begins to increase, by virtue of the layer 42 being compressed to a smaller thickness. However, the relative permittivity of the composite material of the layer 42 is attuned to decrease with the applied electric field at a rate which substantially matches the capacitance increase caused by deformation. In this way, the capacitance change may be partially or fully offset or compensated.

Although the example of FIG. 9 shows a single layer of EAP composite material, in further examples a plurality of layers may be provided.

Figure 10:
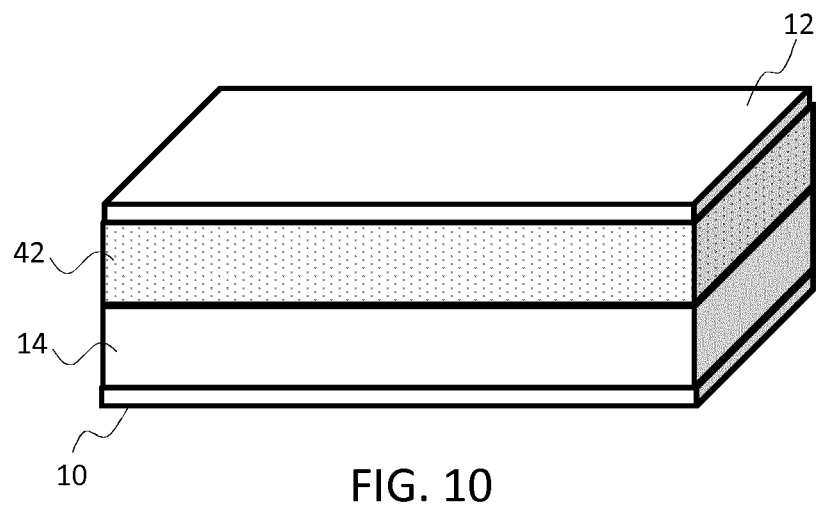
FIG. 10 shows an example actuator member comprising a layer example capacitance compensating composite or mixture and a layer of electroactive polymer.

FIG. 10 shows a second example actuator incorporating an EAP composite material in accordance with the examples and descriptions outlined above. The structure comprises a first layer 14 of standard (non-modified) electroactive polymer, and a second layer 42 of EAP composite material stacked adjacent to the first. The two stacked layers are disposed between a first 10 and second 12 electrode for establishing an electric field across the layers.

Upon application of an electric field between the electrodes 10, 12, both the standard EAP layer 14 and the EAP composite layer 42 deform in response, and the capacitance across each layer correspondingly increases. As in the example of FIG. 9, the EAP composite is adapted to exhibit a relative permittivity which decreases at an appropriate rate with increasing electric field strength to partially or fully offset or compensate for the increased capacitance.

Although the example of FIG. 10 comprises a single layer of EAP material and a single layer of EAP composite material, in further examples, a plurality of one or both of these layers may alternatively be provided. These may be alternately arranged, in order to provide optimal blending or mixing of the respective relative permittivities of the layers.

As discussed above, certain example materials suitable for providing the capacitance compensating effect, may exhibit the desired field-dependent relative permittivity only across a relatively restricted range of applied electric field strengths. In certain cases, this range of field strengths may not match the typical field strengths at which the EAP material is operated and for which it is responsive.

To address this, in accordance with any of the above described embodiments, the actuator member may be further adapted to comprise a permittivity biasing material adapted to permanently alter the relative permittivity of at least a portion of the actuator member. As discussed in the preceding section, such a material may be adapted to effect a fixed or static bias in the effective (average) base-line relative permittivity of the actuator member.

This may have the effect of altering the range of applied field strengths over which the electroactive polymer element of the actuator is responsive. If a biasing material is used which increases the base-line relative permittivity, then this may have the effect of rendering the actuator member responsive across a lower range of field strengths. This is because the resulting displacement field exhibited across the actuator member, for a given applied field strength, will increase in magnitude.

A permittivity biasing material may be used in combination with the compensating material and/or compensating mixture/composite to achieve an actuator member which is responsive across exactly the range of frequencies for which the compensating material exhibits the required field/charge/deformation-dependent permittivity.

The biasing material may form a mixture or composite with one or both of the electroactive polymer material and the compensating material/mixture/composite.

Various means exist for providing a suitable biasing material, a range of which will now be discussed in detail.

Methods are known in the art for altering the dielectric constant of dielectric elastomers (one class of electroactive polymer). In Carpi, F., & et. al. (2011). *Dielectric Elastomers as Electromechanical Transducers: Fundamentals, Materials, Devices, Models and Applications of an Emerging Electroactive Polymer Technology*. Oxford: Elsevier for instance, there are disclosed several methods for increasing the dielectric constant (relative permittivity) of dielectric elastomers. These methods may be classified according to three main groups: random composites, field-structured composites and new synthetic polymers.

The first approach is based upon dispersion into the polymer matrix of a filler, either solid (e.g. powder) or liquid. The second method also exploits a composite approach, although the material in this case is also cured in the presence of an external electric field, thereby aligning dipoles. The third strategy is based on the synthesis of new materials with tailored characteristics.

In Table 1 below is presented a brief outline of the three groups of methods along with a selection of example materials associated with each one.

TABLE 1

A list of methods to modify the relative permittivity of EAP materials, in terms of physical process used, and adopted materials.

| Process | | Filler (where applicable) | | Matrix Elastomers | Matrix Non-elastomers |
|---|---|---|---|---|---|
| Random Composites | Mixing with organic and inorganic fillers (particles) | Ferroelectric/ piezoelectric ceramics | PMN-PT (~5600) $TiO_2$ (86-173) $BaTiO_3$ (1-10k) | Silicone Silicone Silicone | — — PA |
| | | Conductive particles | Fe | Silicone | UP Epoxy resin |
| | | | Cu | | Epoxy resin |
| | | | Cu-coated phospholipids | | — |
| | | | CB | | PE |
| | | | CNT | | Epoxy resin |
| | | Organic monomers | CuPc | Silicone | P(VDF-TrFE) |
| | | Organic polymers | PolyCuPc | PU | EVA |
| | | | PANI (11) | PU | P(VDF-TrFE-CFE) |

TABLE 1-continued

A list of methods to modify the relative permittivity of EAP materials, in terms of physical process used, and adopted materials.

| Process | | Filler (where applicable) | | Matrix Elastomers | Matrix Non-elastomers |
|---|---|---|---|---|---|
| Field-structured composites | Cross-linking in electric field of elastomers with inorganic fillers (particles) | Ferroelectric/piezoelectric ceramics | $SiO_2$ (3.8) $BaTiO_3$, $PbTiO_3$ (~1200) | Silicone Silicone | — Epoxy resin |
| Synthesis of new polymers | Functionalization | — | | S-SBS | P(VDF-TrFE-CFE) |
| | Copolymerization (grafting and/or cross-linking) | — | | FLCE NBR | — |
| | Polymer blending | — | | Silicone/PU Silicone/PHT | — |

The numbers provided are relative electrical permeability of materials. These can be found on the internetwikipeda or standard chemical and physical handbooks.
PMN-PT: lead magnesium niobate-lead titanate;
CB: Carbon black;
CNT: Carbon nano tube;
CuPc: CopperPhthalocyanine;
PANI: Polyaniline;
Silicone: polysiloxanes of the rubber type;
PU: Polyurethane;
PA: Polyacrylate;
PE: polyethylene;
EVA: ethylene vinyl acetate;
S-SBS: styrene-butadiene-styrene;
FLCE: Ferroelectric liquid crystal elastomer;
NBR: Nitrile rubber also known as Buna N rubbers:
PHT: Polyhexahydrotriazines:
Epoxy resin: polyepoxides.

The table shows a sample of state of the art technologies and processes for modifying the relative permittivity of electroactive polymer materials. These include combining an EAP material with a suitable (high relative permittivity) filler material having the effect of increasing the baseline relative permittivity of the EAP material. A composite or mixture hence results, exhibiting the electroactive responsive properties of the EAP material but having an increased base-line relative permittivity. This mixture/composite may render the EAP material responsive to a lower range of applied electric field strengths.

To achieve the desired overall effect, it is necessary to carefully balance the quantity of permittivity biasing material added to the polymer in order that the actuation behaviour is not destroyed or significantly diminished. As discussed for instance in Shakun, A. (2014). *Soft Elastomeric Material with Improved Dielectric Permittivity. Thesis,* 20, incorporation of high relative permittivity fillers, and also other methods of polymer modification, may lead to changes in the material properties which diminish the electrical responsiveness of the polymer. These include changes in elastic modulus (due, for instance, to the method or extent of crosslinking) and chain entanglement, as well as specific inter- and intra-molecular interactions.

However, the amount of added biasing material must nonetheless be high enough to create the necessary alteration to the base-line relative permittivity.

A particular desired increase (for example) in the relative permittivity may be achieved either by adding a relatively large quantity of biasing material having a low(er) dielectric constant, or by adding a relatively smaller quantity of biasing material having a higher dielectric constant. The latter case may generally be preferable, since the addition of a smaller quantity of material is less likely to destroy the electroactive properties of the overall actuator member.

Further literature sources also discuss methods for increasing the relative permittivity of the material by incorporation of fillers with high dielectric constant, or by polymer modification (see for example Shakun, A. (2014). Soft Elastomeric Material with Improved Dielectric Permittivity. *Thesis,* 20).

As demonstrated, in relation to previously discussed embodiments, certain EAPs (dielectric elastomers in particular) may be modified by addition of compensating materials such that their relative permittivity dynamically decreases in correspondence with certain variables or boundary conditions, in particular the electric field strength.

Also, as demonstrated in the preceding paragraphs, there are known from the cited literature certain methods wherein dedicated materials may be added to dielectric elastomer actuators to statically tune their relative permittivity to adopt a different value.

Thus in accordance with the presently described embodiments, it is proposed to modify the electroactive polymer material of the actuator member in such a way that, across a certain range applied electrical field strengths, the effective dielectric constant of the EAP actuator member exhibits a decrease as a function of field strength. The material is chosen such that the rate of this decrease exactly compensates any change in input capacity across the actuator caused by the reduction in thickness (and increase in lateral size) of the electro-active polymer as it is electrically activated. Additionally, permittivity biasing materials may be incorporated to statically shift the base-line relative permittivity such that the range of electric field strengths across which the compensating material exhibits the required decline precisely matches those strengths over which the EAP is standardly operated.

According to certain examples, the actuator member design, in particular the layer thicknesses, may be adapted in order to ensure that the required field strengths are achieved across the actuator member at standard operation voltages.

In accordance with any of the examples and embodiments described above, the provided actuator member may comprise at least two layers of material adapted to exhibit a relative permittivity which decreases with increasing electric field strength, impressed electric charge and/or extent of deformation, wherein each of the layers exhibits said decrease only across a particular range of applied electric field strengths, electric charge values, or mechanical deformations. The layers of material may be layers of compensating material, such as the example layer 38 of the example actuator of FIG. 8. Alternatively, the layers of material may be layers of EAP composite or mixture material, as in the example layer 42 of the actuators of FIGS. 9 and 10.

Furthermore, each layer may comprise or include a biasing material in accordance with one or more of the examples described above, in order to achieve the desired range of activation field strengths/charge values/deformation extents. In particular examples, each layer may comprise a composite or mixture formed of an EAP material and a particular quantity or density of biasing material. To achieve different activation voltages for different layers, the particular density or quantity of the biasing material included in each layer may be varied. In this way each layer may be adapted to have a different particular bias to the base-line relative permittivity. This means that the EAP component(s) of each layer may become active at a different range of voltages.

Figure 1:
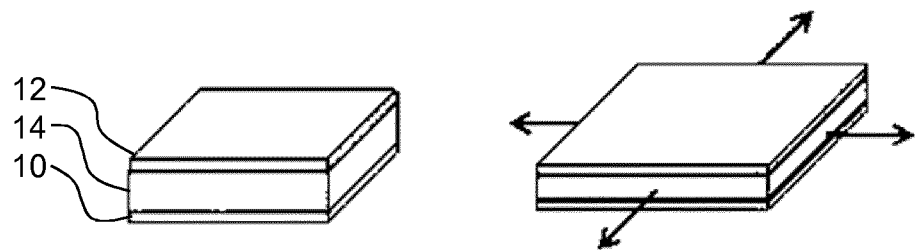
FIG. 1 shows a known electroactive polymer device which is not clamped.
Figure 2:
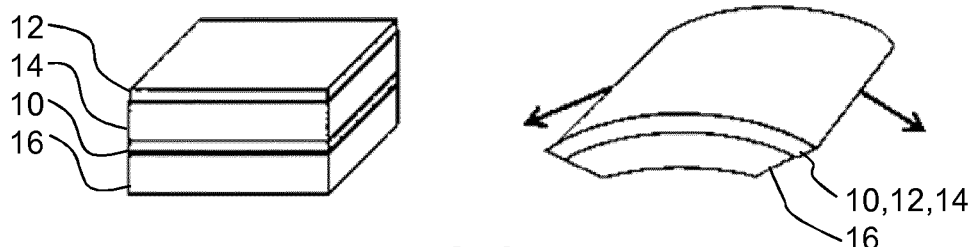
FIG. 2 shows a known electroactive polymer device which is constrained by a backing layer.
Figure 3:
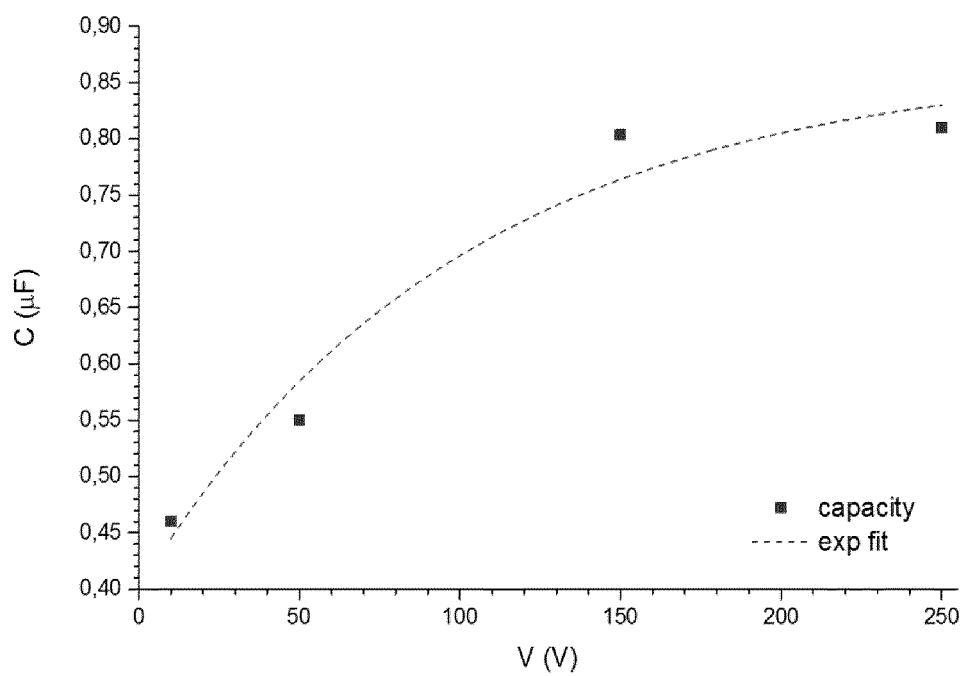
FIG. 3 shows the relationship between capacitance exhibited across an electroactive polymer and applied voltage.
Figure 4:
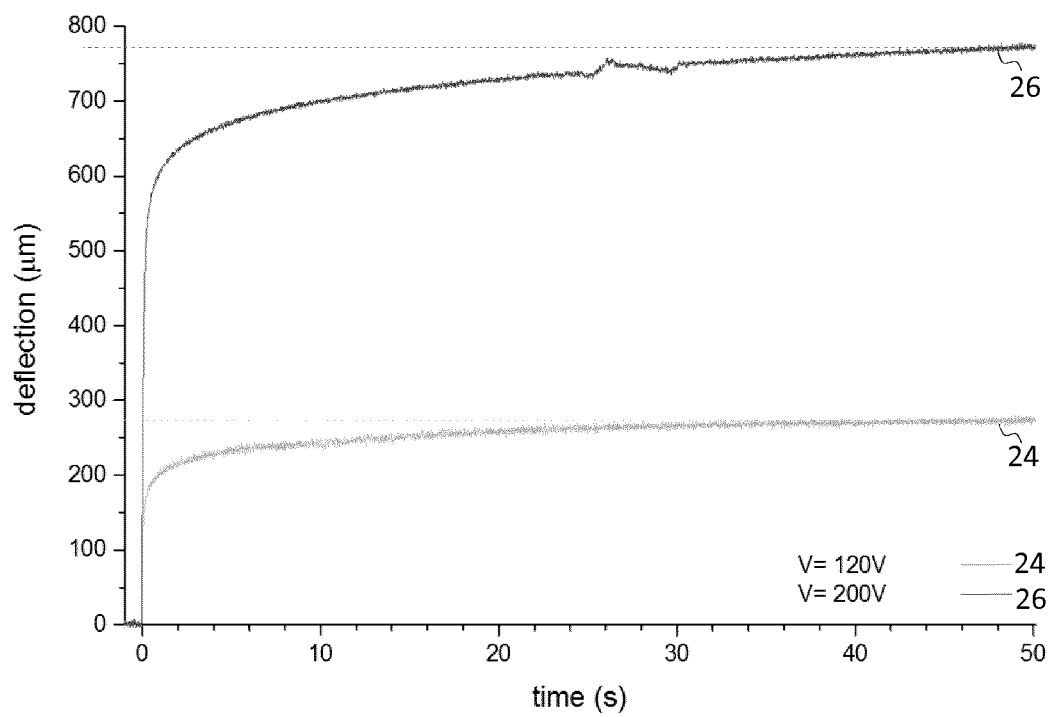
FIG. 4 shows the deflection of an example electroactive polymer as a function of time for two different applied voltages.

Furthermore, as explained above, by using more than one layer, capacitance compensation may be achieved across a broad range of different actuation states and electrical stimulation strengths, even where the particular material or composite used to provide compensation in each layer has only a limited range of applicability. Moreover, a multiple-layer structure such as this allows the logarithmic-like relation between capacitance and applied voltage (shown in FIG. 3) to be more easily, cheaply and simply compensated.

Different materials or compensation means may be used for instance in each layer, each providing a particular level or magnitude of capacitance biasing or offset. By constructing the actuator structure having multiple layers of different biasing magnitudes which become successively activated as the actuator is deformed to a greater and greater extent, the specific pattern of required capacitance compensation may be readily achieved.

According to at least some examples, the above embodiment may be achieved by providing layers formed of a material which is differently composed or adapted in each of the relevant layers, or may be achieved by providing multiple layers of the same material, but having different thicknesses. The different thickness of each layer may affect the particular electric field strength for instance at which the relative permittivity begins to exhibit the declining behaviour.

In accordance with any of the above examples, there may be provided one or more mixed EAP layers comprising an EAP (or EAP composite) in combination with a quantity of permittivity biasing material, wherein the density of the biasing material varies in one or more directions across the layer. This may allow for different interesting modes of deformation, for example wedge, or even wavy shapes, to be produced as a function of applied electric field strength.

According to any of the above embodiments, there may be provided two or more layers comprising capacitance compensation material, or EAP composite material, wherein the respective material of each layer is adapted to follow a different trend or pattern of declining relative permittivity to the other layer(s). This different trend or pattern may include different activation points and/or slopes, and/or may include different local minima or maxima for example.

Figure 11:
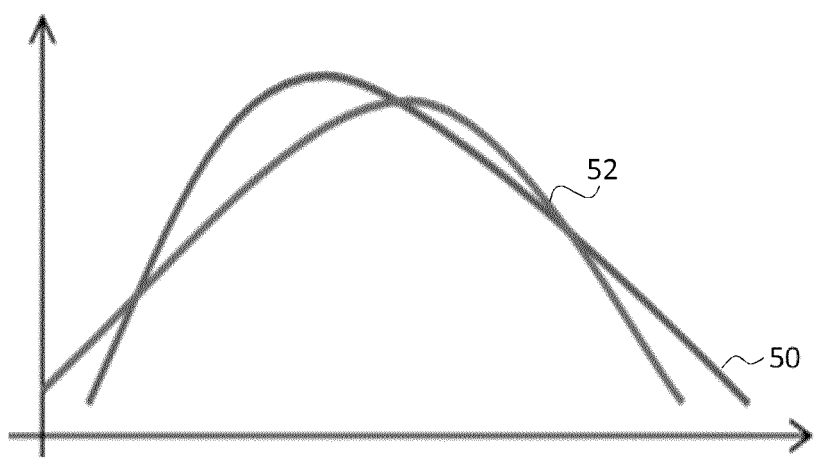
FIG. 11 shows relative permittivity versus applied electric field trend lines for two example capacitance compensating layers.

FIG. 11 illustrates this concept, wherein there are shown trend lines 50, 52 for two example compensating material layers, showing relative permittivity (y-axis) versus applied electric field strength (x-axis). The two layers each exhibit a different permittivity to field strength behaviour pattern and each have a different maximum point and different minimum point.

In examples, a plurality of layers may be provided, having respective relative permittivity trends which, across a broad range of electric field values, together blend to provide a substantially even or uniform decline in relative permittivity across said range. In this way, a substantially uniform capacitance can be established across a wide range of applied field strengths, even where the permittivity curve of each layer individually is relatively narrow for example.

Furthermore, in accordance with any of the above described embodiments, there may be provided a plurality of layers comprising capacitance-compensating material or EAP composite material, wherein the material of each layer is adapted to exhibit a relative permittivity which decreases with applied electric field strength only for a particular range of AC field frequencies. This provides flexibility in the operation frequency of the actuator member, since the same capacitance compensation effect may be achieved at different stimulation frequencies.

In accordance with any of the above-described embodiments, the actuator member may further comprise an electrode arrangement comprising two or more pairs of electrodes, each pair arranged so as to sandwich a different section or region of the actuator member. Each pair may be operated separately (for example by means of a dedicated driver). One common ground/reference electrode may additionally be provided. In accordance with such an embodiment, the electric field strength across different portions or regions of the EAP may be varied, providing greater flexibility in terms of achievable deformation shapes and behaviours.

In alternative examples, the dedicated drivers for each electrode pair may be replaced by a resistive and/or reactive network connecting the electrodes pairs. Due to the voltage drop across the network, a different (but fixed) voltage distribution may be generated between each pair, causing a variation in activation level at different regions of the actuator member. This would again result in greater flexibility in terms of the deformation shape and behaviour of the actuator member.

A time-dependency between the different pairs (and the corresponding stimulated regions of the actuator member) could be achieved by adding a reactive element to the network (such as a small surface-mount (SMD) capacitor or inductor).

According to further examples still, the resistive and/or reactive network described above may be adapted so as to provide a single common driver for the electrode pair, wherein the common output voltage is separated into different amplitudes via a network. Each branch may be connected to one of each of the electrode pairs. Such an arrangement may confer the advantage of allowing a user of the actuator to customise the structure of the network (since it is no longer integrated with the actuator itself).

Materials suitable for the EAP layer are known. Electroactive polymers include, but are not limited to, the subclasses: piezoelectric polymers, electromechanical polymers, relaxor ferroelectric polymers, electrostrictive polymers, dielectric elastomers, liquid crystal elastomers, conjugated polymers, Ionic Polymer Metal Composites, ionic gels and polymer gels.

The sub-class electrostrictive polymers includes, but is not limited to:

Polyvinylidene fluoride (PVDF), Polyvinylidene fluoride-trifluoroethylene (PVDF-TrFE), Polyvinylidene fluoride-trifluoroethylene-chlorofluoroethylene (PVDF-TrFE-CFE), Polyvinylidene fluoride-trifluoroethylene-chlorotrifluoroethylene) (PVDF-TrFE-CTFE), Polyvinylidene fluoride-hexafluoropropylene (PVDF-HFP), polyurethanes or blends thereof.

The sub-class dielectric elastomers includes, but is not limited to:

acrylates, polyurethanes, silicones.

The sub-class conjugated polymers includes, but is not limited to:

polypyrrole, poly-3,4-ethylenedioxythiophene, poly(p-phenylene sulfide), polyanilines.

Ionic devices may be based on ionic polymer-metal composites (IPMCs) or conjugated polymers. An ionic polymer-metal composite (IPMC) is a synthetic composite nanomaterial that displays artificial muscle behavior under an applied voltage or electric field.

In more detail, IPMCs are composed of an ionic polymer like Nafion or Flemion whose surfaces are chemically plated or physically coated with conductors such as platinum or gold, or carbon-based electrodes. Under an applied voltage, ion migration and redistribution due to the imposed voltage across a strip of IPMCs result in a bending deformation. The polymer is a solvent swollen ion-exchange polymer membrane. The field causes cations travel to cathode side together with water. This leads to reorganization of hydrophilic clusters and to polymer expansion. Strain in the cathode area leads to stress in rest of the polymer matrix resulting in bending towards the anode. Reversing the applied voltage inverts the bending.

If the plated electrodes are arranged in a non-symmetric configuration, the imposed voltage can induce all kinds of deformations such as twisting, rolling, torsioning, turning, and non-symmetric bending deformation.

In all of these examples, additional passive layers may be provided for influencing the electrical and/or mechanical behavior of the EAP layer in response to an applied electric field.

The EAP layer of each unit may be sandwiched between electrodes. The electrodes may be stretchable so that they follow the deformation of the EAP material layer. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylenedioxythiophene) poly(styrenesulfonate) (PEDOT:PSS). Metalized polyester films may also be used, such as metalized polyethylene terephthalate (PET), for example using an aluminum coating.

The invention can be applied in many EAP and photoactive polymer applications, including examples where a passive matrix array of actuators is of interest.

In many applications the main function of the product relies on the (local) manipulation of human tissue, or the actuation of tissue contacting interfaces. In such applications EAP actuators for example provide unique benefits mainly because of the small form factor, the flexibility and the high energy density. Hence EAP's and photoresponsive polymers can be easily integrated in soft, 3D-shaped and/or miniature products and interfaces. Examples of such applications are:

Skin cosmetic treatments such as skin actuation devices in the form of a responsive polymer based skin patches which apply a constant or cyclic stretch to the skin in order to tension the skin or to reduce wrinkles;

Respiratory devices with a patient interface mask which has a responsive polymer based active cushion or seal, to provide an alternating normal pressure to the skin which reduces or prevents facial red marks;

Electric shavers with an adaptive shaving head. The height of the skin contacting surfaces can be adjusted using responsive polymer actuators in order to influence the balance between closeness and irritation;

Oral cleaning devices such as an air floss with a dynamic nozzle actuator to improve the reach of the spray, especially in the spaces between the teeth. Alternatively, toothbrushes may be provided with activated tufts;

Consumer electronics devices or touch panels which provide local haptic feedback via an array of responsive polymer transducers which is integrated in or near the user interface;

Catheters with a steerable tip to enable easy navigation in tortuous blood vessels;

Measurements of physiological human body parameters such as heart beat, SpO2 and blood pressure.

Another category of relevant application which benefits from such actuators relates to the modification of light. Optical elements such as lenses, reflective surfaces, gratings etc. can be made adaptive by shape or position adaptation using these actuators. Here one benefit of EAPs for example is a lower power consumption.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An actuator member comprising:
   an electroactive polymer material,
      wherein the electroactive polymer material is arranged to deform in dependence upon a magnitude of an applied electric field,
      wherein the actuator member has a capacitance and a capacitance compensating material,
      wherein the capacitance compensating material is arranged to at least partially offset changes in the capacitance, and
      wherein the changes in the capacitance are caused by deformation of the actuator member.

2. The actuator member as claimed in claim 1, wherein the capacitance compensating material is arranged to at least partially offset the changes in the capacitance by reducing a relative permittivity of at least a portion of the actuator member.

3. The actuator member as claimed in claim 2, wherein the capacitance compensating material is arranged to induce a decrease in the relative permittivity of the at least a portion of the actuator member in dependence upon at least one of: an increasing magnitude of an applied electric field, an increase in an impressed electric charge, and a mechanical deformation of the actuator member.

4. The actuator member as claimed in claim 1, wherein the capacitance compensating material independently exhibits a decrease in capacitance across it in response to at least one of: an increasing magnitude of an applied electric field, an increase in an impressed electric charge, and a mechanical deformation of the actuator member.

5. The actuator member as claimed in claim 4, wherein the capacitance compensating material exhibits a decrease in an effective relative permittivity to effect the decrease in the capacitance.

6. The actuator member as claimed in claim 4,
wherein the capacitance compensating material comprises a plurality of particles formed of the capacitance compensating material, and
wherein the plurality of particles are embedded within the electroactive polymer material.

7. The actuator member as claimed in claim 4, wherein the capacitance compensating material comprises a coating covering at least a portion of the electroactive polymer material.

8. The actuator member as claimed in claim 4, wherein the actuator member comprises at least a first layer of the electroactive polymer material, and at least a second layer comprising the capacitance compensating material.

9. The actuator member as claimed in claim 1,
wherein the capacitance compensating material comprises a material which forms a mixture or composite with the electroactive polymer material, and
wherein the mixture or composite exhibits a decrease in a capacitance across it in response to at least one of: an increasing magnitude of an applied electric field, an increase in an impressed electric charge, and a mechanical deformation of the actuator member.

10. The actuator member as claimed in claim 9,
wherein the actuator member comprises one or more layers of the mixture or composite.

11. The actuator member as claimed in claim 1, further comprising a permittivity biasing material, wherein the permittivity biasing material is arranged to permanently alter a relative permittivity of at least a portion of the actuator member.

12. The actuator member as claimed in claim 1, comprising at least a first layer and a second layer,
wherein each of the at least first layer and the second layer is arranged to exhibit a capacitance which decreases in response to at least one of: an increasing magnitude of an applied electric field, an increase in an impressed electric charge, and a mechanical deformation of the actuator member, and
wherein each of the at least first layer and the second layer is arranged to exhibit the decreasing capacitance only across a different particular range of: electric field strengths, impressed electric charge values, or mechanical deformations.

13. The actuator member as claimed in claim 12,
wherein one or more of the at least first layer and the second layer comprises a permittivity biasing material, and
wherein the permittivity biasing material is arranged to permanently alter a relative permittivity of at least a portion of the actuator member.

14. The actuator member as claimed in claim 1, comprising at least a first layer and a second layer, wherein each of the at least first layer and the second layer is arranged to exhibit a capacitance which decreases in response to a different one of following: an increasing magnitude of an applied electric field, an increase in an impressed electric charge, and a mechanical deformation of the actuator member.

15. The actuator member as claimed in claim 1, comprising at least a first layer and a second layer,
wherein each of the at least first layer and the second layer is arranged to exhibit a capacitance which decreases in response to at least one of: an increasing magnitude of an applied electric field, an increase in an impressed electric charge, and a mechanical deformation of the actuator member, and
wherein each of the at least first layer and the second layer is arranged to exhibit the decreasing capacitance only across a different particular range of frequencies of an applied electric field.

16. The actuator member as claimed in claim 9, wherein the capacitance compensating material exhibits a decrease in an effective relative permittivity to effect the decrease in capacitance.

17. The actuator member as claimed in claim 9, wherein the actuator member comprises one or more layers of electroactive polymer material.

18. The actuator member as claimed in claim 1, comprising at least a first layer and a second layer,
wherein each of the at least first layer and the second layer is arranged to exhibit an effective relative permittivity which decreases in response to at least one of: an increasing magnitude of an applied electric field, an increase in an impressed electric charge, and a mechanical deformation of the actuator member, and
wherein each of the at least first layer and the second layer is arranged to exhibit the decreasing capacitance only across a different particular range of: electric field strengths, impressed electric charge values, or mechanical deformations.

19. The actuator member as claimed in claim 1, comprising at least a first layer and a second layer, wherein each of the at least first layer and the second layer is arranged to exhibit an effective relative permittivity which decreases in response to a different one of following: an increasing magnitude of an applied electric field, an increase in an impressed electric charge, and a mechanical deformation of the actuator member.

20. The actuator member as claimed in claim 1, comprising at least a first layer and a second layer,
wherein each of the at least first layer and the second layer is arranged to exhibit an effective relative permittivity which decreases in response to at least one of: an increasing magnitude of an applied electric field, an increase in an impressed electric charge, and a mechanical deformation of the actuator member, and
wherein each of the first layer and the second layer is arranged to exhibit the effective relative permittivity only across a different particular range of frequencies of an applied electric field.

* * * * *